May 10, 1966 AKIO AMAYA 3,250,693

METHOD AND APPARATUS FOR THE MANUFACTURING CALIBRATION OF TUNNEL DIODES BY ETCHING

Filed June 5, 1961

Inventor
Akio Amaya by Hill, Sherman, Meroni, Gross & Simpson Attnys.

United States Patent Office 3,250,693

Patented May 10, 1966

3,250,693

METHOD AND APPARATUS FOR THE MANUFACTURING CALIBRATION OF TUNNEL DIODES BY ETCHING

Akio Amaya, Tokyo, Japan, assignor to Sony Corporation, Tokyo, Japan, a corporation of Japan Filed June 5, 1961, Ser. No. 114,781
Claims priority, application Japan, June 8, 1960, 35/27,369
8 Claims. (Cl. 204—143)

This invention relates to a method and apparatus for the mass production manufacture of tunnel diodes and more particularly to such a method and aparatus for etching such tunnel diodes to make them of substantially uniform characteristics.

It is desirable to manufacture tunnel diodes (Esaki diodes) having characteristics with substantially uniform and predetermined values of the peak current before their negative resistance regions (that is, their low impedance switching points).

Heretofore, in the manufacture of tunnel diodes, their characteristics or their peak current before their negative resistance regions have been made generally uniform by etching or dissolving away the edges of such previously made tunnel diodes to reduce their effective junction area or the area of their transition regions available for current flow. This reduces their peak current value before their negative resistance regions in their characteristics or curves. This area or their peak current values have been periodically and manually checked by the removal of such a diode from the etchant solution and the connecting of electrodes to the diode and lead wires to a suitable device for the direct reading of the diode's characteristics (for example, to a cathode-ray tube oscillograph). Thus, the characteristic of each diode has been examined and checked periodically after it has been etched for a time.

After this checking, if the amount of etching was not sufficient, the etching was repeated for a suitable period after which the tunnel diode was again removed from the etchant and its characteristic again checked in similar fashion. Procedures of this general type have previously been employed in this art. However, this complicated method required a skilled operator to personally and precisely check the characteristic of each tunnel diode being manufactured and calibrated. Moreover, this prior method took too much time and inevitably involved human errors. Further, this previous method can produce only a relatively small number of such calibrated tunnel diodes in a given period of time. For these and other reasons, this previous method is unsuitable for mass production.

Therefore, it is an object of this invention to provide methods and apparatus for the manufacture of tunnel diodes which are suitable for mass production and, more particularly, to provide such manufacturing methods and apparatus using etching to reduce the values of the peak current before their negative resistance regions of the characteristics of previously made tunnel diodes to a substantially uniform and predetermined value by a precise checking which is simple and requires no complicated operations.

Another object of this invention is to provide a method and apparatus for the manufacturing calibrating of previously made tunnel diodes by etching them in an electrolytic etchant to give them all a substantially uniform and predetermined, low impedance switching point in their N-shaped characteristics.

A further object of this invention is to provide a method and apparatus for the manufacturing calibrating of previously made tunnel diodes by a simple treatment in an electrolytic etchant without intermediate removals therefrom or without excess etching or time consuming operations to more economically and accurately achieve the same predetermined N-shaped characteristic for all of said diodes being so calibrated.

A still further object of this invention is to provide a method and apparatus for the manufacturing and calibration of already made tunnel diodes by etching in which both checking and etching voltages and currents are applied to the tunnel diode while it is continuously immersed in an electrolytic etchant and whereby such checking and etching voltages and currents are accurately cutoff when the checking voltage across said diode is detected at a predetermined higher value or at a voltage rise or jumping showing when the desired and predetermined calibration for the diode characteristic has been reached.

Still another object of this invention is to provide a simple and accurate method and apparatus for the mass production manufacturing calibration of previously made tunnel diodes by substantially a purely chemical etching treatment to give them substantialy uniform and predetermined N-shaped characteristics.

An additional object of this invention is to provide a practical and superior method and apparatus for the manufacturing calibration of previously made tunnel diodes by treating them in a substantially chemical etchant wherein the substantially chemical etching treatment is accurately and automatically stopped by the jumping or rapid increase of the checking voltage across the tunnel diode while it is in the etchant.

Other objects, features and advantages of this invention will become more fully apparent from the following description taken in connection with the accompanying drawings in which.

Figure 1:
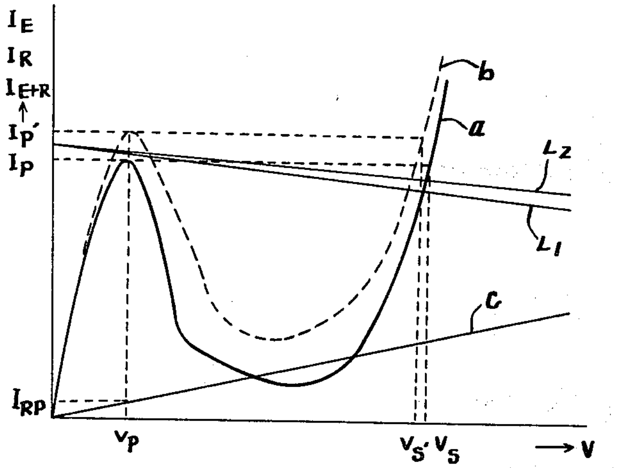
FIGURE 1 shows curves illustrating the operation of an etching method and apparatus according to this invention for the calibration of previously made tunnel diodes.

A typical tunnel diode has a generally N-shaped static characteristic or curve as shown by the curve *a* in FIGURE 1, wherein the abscissa is the voltage V applied to, or across, the tunnel diode and the ordinate is the current $I_E$. In the case where such a current $I_E$ through such a tunnel diode is in the forward direction and through a comparatively high resistance (to give a voltage controlled switching action or a switching type circuit for the tunnel diode, as is well understood by those skilled in this art), when this current $I_E$ reaches a maximum current value $I_P$ at the maximum point in the N-shaped curve *a* before its negative resistance region (that is, at its low impedance switching point), the voltage rapidly rises and switches or jumps to the higher value $V_S$ from its previous lower value $V_P$ (at the said maximum point or peak of the N-shaped curve *a* before its negative resistance region). However, at this new and increased voltage $V_S$, the current still has the same value $I_P$ as it had prior to the switching or for the voltage $V_P$. This rapid increase of the voltage or this switching may also be considered here as a jumping of the checking voltage, particularly when applied in pulses or the like.

When a previously made tunnel diode is soaked or immersed in a suitable etchant solution and the current is passed through the tunnel diode itself, there will necessarily be some leakage current $I_R$ (as in FIGURE 1) flowing around or bypassing the diode in the etchant solution. This $I_R$ current will be in addition to the main current $I_E$ all of which passes through the tunnel diode itself. Such a tunnel diode 8 is shown in the etchant tank or container 7 of FIGURE 2. The curve or line *c* of FIGURE 1 shows the values of this leakage current $I_R$ for the various values of the voltage V. Since the curve *a* shows the characteristic for a typical such tunnel diode being considered here by itself or not bypassed by current flow through etchant solution, the total current $I_{E+R}$ for the various values of voltage V for this same tunnel diode while immersed in the etchant is shown by the curve *b* which is shown by the dotted line in FIGURE 1. This curve *b* represents the additions of the current values of the curves *a* and *c* for each value of the voltage V.

Accordingly, when a previously manufactured diode 8 is being etched to have its junction area reduced as described above and is thus immersed in the etchant, the above described switching or jumping of the voltage will occur at the maximum current value point of the curve *b* before its negative resistance or at the voltage $V_P$ as shown in FIGURE 1.

The corresponding and higher current value for curve *b* is $I_P'$ and it is at this point that the voltage jumps or switches to the higher value shown by $V_S'$ of FIGURE 1.

Now, during the above-described etchant treatment of the diode 8 and the corresponding reduction of its junction cross-sectional area, the reduction in this area causes a change in the characteristic of the diode being treated and a reduction in its ordinate or height at voltage value $V_P$. When this peak current height of curve *b* is reduced below the value I, the voltage jumps or switches as described above. At this time, if the value of the leakage current $I_R$ by passing around through the etchant is $I_{RP}$ then the maximum current value $I_P$ for the tunnel diode 8 becomes substantially equal to the difference between maximum current $I_P'$ and the current $I_{RP}$. However, $I_{RP}$ is determined by a number of conditions including, for example, the concentration and temperature of the etchant and shape and size of the diode and its electrodes. This jumping action of the voltage is detected or checked by suitable means at substantially constant conditions to give uniformly calibrated diodes. The etching treatment of the diode such as 8 is stopped when the desired diode characteristic has been reached and the voltage jumping action occurs at the predetermined maximum current value $I_P$. Where direct current is used as the checking or detecting current, this voltage jumping action is more easily caused by an external stimulus which may be, for example, induction on the diode and its lead wires to produce a stimulus or change in the voltage across this voltage controlled tunnel diode 8. This sensitivity to external stimuli reduces the uniformity of the characteristics of tunnel diodes thus calibrated. Relatively long lead wires are required for the etchant treatment of a diode 8 so that the above noted voltage jumping is apt to occur in a range of current values from 70% to 80% of the desired maximum current value $I_P$.

For these reasons it is desirable and preferred to use repeated currents or current pulses having a predetermined peak value as the checking or detecting current for the tunnel diode 8 immersed in the etchant, thus substantially eliminating the adverse effects of the above referred to external stimuli.

Figure 2:
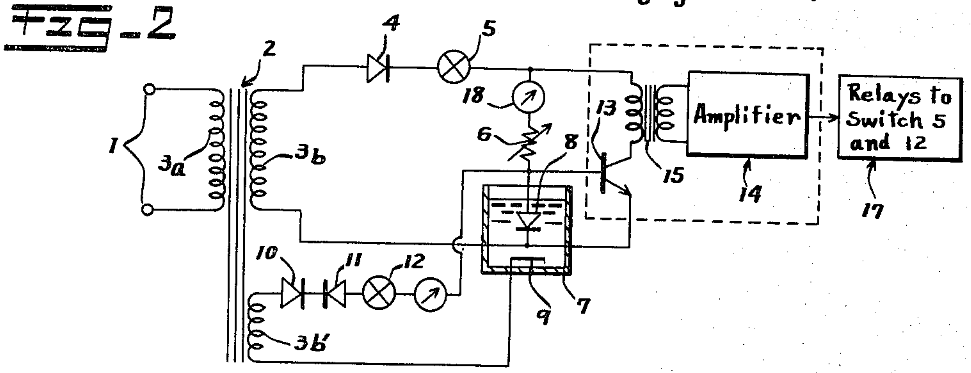
FIGURE 2 is a schematic view including a circuit diagram and illustrates one embodiment of this invention.

In FIGURE 2, a transformer is designated as a whole by 2. This transformer has a primary coil 3*a* which is connected to an alternating current source 1. This transformer also has the secondary coil 3*b* and a tertiary coil 3*b'* connected as shown.

As also shown in FIGURE 2, there is a suitable tank, container, or the like, 7 for the electrolyic etchant. The tunnel diode 8 being etched and thus calibrated and electrode 9 are immersed in this container 7. One terminal of the secondary coil 3*b* of the transformer 2 is connected to the positive electrode of the tunnel diode 8 (immersed in etchant) through a germanium or silicon diode 4, normally closed switch or contact point means 5 and a variable resistor 6. If desired, this circuit through the tunnel diode 8 may also include a suitable current measuring meter or an ammeter 18. The other terminal 3*b* is readily connected to the negative electrode of the tunnel diode 8, thereby forming a closed circuit. It is important to note that the one-way or rectifying diode 4 is connected in its forward direction with respect to the tunnel diode 8. Also this circuit does not include any damping or smoothing means so that it supplies a half wave rectified or half-cycle wave from current through the tunnel diode 8. This half-cycle wave form current is shown by 16 in FIGURE 3A. For other applications than this invention such a damping or smoothing means is often included in a rectifying circuit including a rectifying diode such as 4 but this is not desired here since it is important to obtain the separate or spaced apart checking pulses 16.

Figures 3A, 3B:
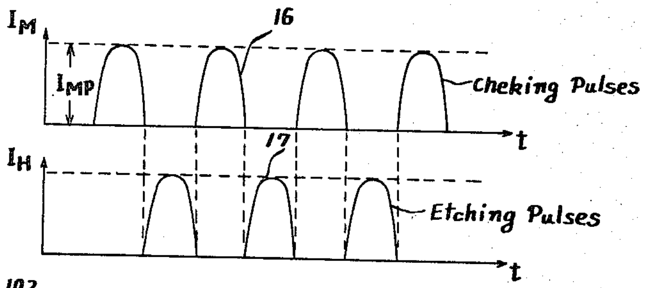
FIGURE 3A shows curves for checking pulses relating to the operation of the circuit of FIGURE 2.
FIGURE 3B shows curves for etching pulses relating to the operation of the circuit of FIGURE 2 and shown to the same time scale as in FIGURE 3A.

One terminal of the tertiary transformer 3*b'* is connected to the positive electrode of the tunnel diode 8 through a rectifying diode 10, preferably a Zener diode 11 in reverse direction, and a normally closed switch or contact point unit 12, as shown. The other terminal 3*b'* is connected directly to the electrode 9 which is in the etchant in the tank or bath 7. This portion of the circuit conducts current 17 (of FIGURE 3B) between the diode 8, the etchant, and the electrode 9. This current 17 is similar to that applied across the diode 8 and is of the half-wave rectified or half-cycle wave form substantially as shown in FIGURE 3B. The phase relation or sense between the secondary coil 3*b* and the tertiary coil 3*b'* of the transformer 2 is so selected that the checking current pulses 16 (which mainly go through the diode 8) and the etching current pulses $I_H$ or 17 (through the etchant) are substantially out of phase or have a phase difference of, for example, 180° as shown in FIGURES 3A and 3B, these two figures having the same time scale.

As also shown in FIGURE 2, the transistor 13 is connected as shown across the diode 8 for detecting or checking the voltage across the two electrodes of this diode 8. Preferably, the semi-conductor material of this transistor 13 is selected to match that of the tunnel diode 8. As example, if tunnel diode 8 is of germanium, a germanium transistor is preferably used at 13 or similarly if tunnel diode 8 is of gallium arsenide or silicon then a silicon transistor is used at 13. That is, the transistor 13 is so constructed and is of an appropriate semi-conductor material and mechanism whereby a forward current does not flow through the emitter junction of this transistor even if the voltage in the negative resistance region of the tunnel diode 8 is applied between emitter and base of this transistor 13.

As shown in FIGURE 2, the base of the transistor 13 is connected to the positive electrode of the tunnel diode 8 and the emitter of transistor 13 is connected to the negative electrode of the tunnel diode 8. As shown, the transistor is also connected through a suitable transformer 15 to the input side of a suitable amplifier unit designated as a whole by 14. The output side of this amplifier unit 14 connected as shown to actuate or control a suitable relay and switching unit designated as a whole 17. This unit 17 contains suitable relays (not shown in further detail) to operate the switches 5 and 12 to close them when an output signal is obtained from the amplifier unit 14.

It will thus be apparent that the foregoing apparatus provides means whereby the voltage across the tunnel diode 8 is checked alternately with the pulses or brief intervals of etching performed on this same tunnel diode 8. This is done by the substantially out-of-phase series of current pulses or half-cycle wave form currents 16 and 17 which are supplied, respectively, across the tunnel diode 8 and between tunnel diode 8 and the electrode 9 through the etchant.

Thus, in the operation of this apparatus there is a gradual or progressive etching or dissolving away of the edges to reduce the effective junction area of one of the previously made tunnel diodes 8 being calibrated. When the current $I_P$ through the tunnel diode 8 itself becomes equal to the predetermined current value $I_{MP}-I_{RP}$ (where $I_{MP}$ is the peak value of the current $I_M$ or 16) the voltage across the terminals of the diode 8 jumps and this rapidly increasing or jumping voltage is detected by the transistor 13 and amplified by the amplifier unit 14, thereby operating the relays of the unit 17 to open the switch or contact point units 5 and 12. The etching is thus accurately stopped or finished to give a calibrated tunnel diode 8 having the desired characteristic or height of its peak current value before its negative resistance region.

In practice and as illustrated here, there need be no appreciable intervals or changeover periods between the checking current pulses and the etching current pulses. However, it is to be understood that predetermined intervals between these pulses may be employed if so desired. It will be understood that the characteristic or value of the peak current before the negative resistance region for any one of the tunnel diodes 8 being calibrated (that is the value of the current $I_P$) may be selectively adjusted to any desired value by suitable means such as an adjustment of the effective value of the variable resistance 6. This variable resistance 6 always supplies a relatively high resistance in a range of 5 kilo-ohms to 30 kilo-ohms in series with the tunnel diode 8, this resistance giving a switching type load Lines $L_1$ and $L_2$ as shown in FIGURE 1 for the circuit through the tunnel diode 8 so that the slope of these load lines $L_1$ and $L_2$ (which represents the value of the resistance 6 and other series resistances) is less or more nearly horizontal than the slop of the negative resistance region of the characteristics or curves *a* or *b*. As is well understood by those skilled in this art, this provides what may be termed a switching type circuit whereby the above described jumping of the voltage may be used to shut down or stop the etching.

Since the etching is done in small increments or during very short time intervals by the pulses or half-cycle wave form alternating current 17 which pulses are alternated with the pulses of the checking current 16, any appreciable undesirable excess etching is prevented. A large number of previously made tunnel diodes may be rapidly, accurately and economically etched and calibrated to any desired predetermined value of $I_P$.

In the electrolytic etching of tunnel diodes as described above, a residual voltage is generated between positive and negative electrode of tunnel diode 8. Hence, this residual voltage supplied to the tunnel diode during the checking in addition to the checking pulses or the half-cycle wave form voltages. This may produce a mischecking or is a source of inaccuracy which is preferably avoided by use of suitable means or circuits to control the width or phase of the etching currents or pulses 17. The Zener diode 11 is connected as shown in the circuit of FIGURE 2 for this purpose.

Preferably, in practice, the generally concurrent or simultaneous out-of-phase etching and checking is done in two steps or in two successive processes. As examples, in the first stop the maximum current of the etching current pulses is 50 milliamperes and the maximum current of the checking or detecting current pulses is 0.6 milliampere. In the second such step the current of the etching pulses is 10 milliamperes and the current for the checking or detecting pulses is 0.4 milliampere. For each step the peak current value before the negative resistance region of the tunnel diode or the current $I_P$ is 1 milliampere. This procedure gives an accuracy in uniformity whereby 80% or more of all of the so calibrated or treated tunnel diodes have characteristics which are in a range of plus or minus 0.1 milliampere from the predetermined and desired 1 milliampere value for $I_P$. It is noted that in this case and in the electrolytic etching as described above, the etchant is an accurate solution of 5% potassium hydroxide.

Figure 4:
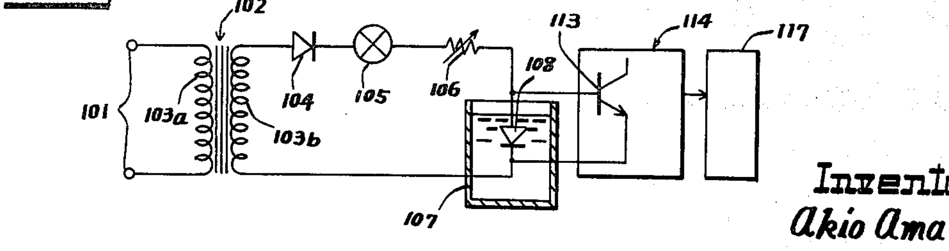
FIGURE 4 is a generally schematic view and circuit diagram illustrating another embodiment of this invention.

Referring to FIGURE 4, a chemical type etching treatment will now be described to give a chemical etching of the tunnel diode to be calibrated. In FIGURE 4 the several elements carry the same reference numbers increased by 100 as do the corresponding elements of FIGURE 2 since the arrangement and circuit of FIGURE 4 is essentially like that of FIGURE 2 except that the etchant in tank or bath 107 is chemical so that the circuit portions such as the tertiary coil *3b'*, the electrode 9, their connection means and other such parts are omitted. The operation of the circuit shown in FIGURE 4 will be apparent to those skilled in this art from the foregoing description of FIGURE 2.

In this case the etching of the tunnel diode 108 is done only by the action of the etchant itself or purely chemically. While apparatus and methods which are either electrolytic or chemical in their etching or dissolving action have been disclosed above, it is to be understood that both of these two actions or a mixture thereof may by employed within the broader purview of this invention. In the case of chemical etching, the current for checking the degree of etching may be a direct current or need not be in pulses or the half-cycle or half-wave rectified alternating current as described above in connection with FIGURES 2 and 3. In such chemical etching, it is preferred to use a full wave rectified current through the tunnel diode as a checking current or series of checking pulses. Thus, a repeating series of currents or pulses having a certain predetermined peak value is used in this chemical form to check the degree or amount to which the etching has proceeded. In practice, it is preferred that such chemical etching be done in two stages or by two successive processes. As examples, the etchant for both such stages or successive processes is an aqueous solution of 2% potassium hydroxide, 0.2% hydrogen dioxide (hydrogen peroxide) and 0.2% EDTA (ethylenediamine tetraacetic acid disodium salt). In the first such stage, this etchant solution is kept at about 40° C. while a checking current I of 2 milliamperes is supplied through the tunnel diode 108. In the second such stage, the same etchant is kept at a lower temperature of 25° C., but a materially lower checking current I of 0.7 milliampere is used. The etching action is stopped when the jumping voltage is reached at the end of each such stage or process and, preferably, the tunnel diode such as 108, is taken out of the etchant and washed.

By this chemical and two-stage or two-step procedure, tunnel diodes so treated or calibrated will have a high degree of accuracy and uniformity. As an example, 90% or more of so treated tunnel diodes for a desired I current value of 2 milliamperes will be in a range of plus or minus 0.2 milliampere from this value.

It will be apparent that in the several forms of this invention as described above, the progress or extent of the etching treatment of the tunnel diodes is electrically detected or checked to thereby control or stop the etching action to a high degree of accuracy, for the efficient, mass production manufacturing calibration of large numbers of tunnel diodes with uniform characteristics or uniform values of $I_P$. Such diodes are thus produced efficiently and without any excess etching.

It will be apparent to those skilled in this art that many modifications and variations may be effected in the teachings hereof without departing from the scope of the novel concepts of this invention.

What is claimed is:

1. The method of etching a tunnel diode to achieve a predetermined peak current characteristic in the diode which comprises immersing said diode in an etchant, periodically passing a pulsating checking current in the forward direction through said diode while so immersed, sensing the voltage across said diode as etching proceeds, and terminating the etching immediately when said voltage jumps through the switching region characteristic of a tunnel diode.

2. The method of etching a tunnel diode to achieve a predetermined current characteristic in the diode which comprises immersing said diode into an electrolytic etching solution, alternately applying direct current checking pulses to said diode in the forward direction and direct current etching pulses through said solution, sensing the voltage across said diode as etching proceeds, and terminating the etching immediately when said voltage jumps through the switching region characteristic of a tunnel diode.

3. The method of claim 2 in which the etching is carried out in two stages, the peak values of the checking and etching currents being greater in the first stage than in the second.

4. The method of etching a tunnel diode to achieve a predetermined peak current characteristic in the diode which comprises immersing said diode in an etchant solution, applying a series of full wave rectified checking current pulses to said diode in the forward direction, sensing the voltage across said diode as etching proceeds, and terminating the etching immediately when said voltage jumps through the switching region characteristic of a tunnel diode.

5. The method of claim 4 in which the etching is carried out in stages, the checking current being decreased and the temperature of said etching solution being decreased in succeeding stages.

6. An apparatus for etching a tunnel diode to achieve a predetermined peak current characteristic which comprises a container having an etchant solution therein, means for immersing said diode in said container, means for applying a pulsating checking current through the immersed diode in the forward direction, voltage sensing means connected across said diode, and means responsive to a voltage jump sensed by said sensing means to terminate etching upon sensing of said jump.

7. An apparatus for etching a tunnel diode to achieve a predetermined peak current characteristic which comprises a container having an etchant solution therein, means for immersing said diode in said container, means for applying checking current pulses through the immersed diode in the forward direction, an electrode in spaced relation to said diode while immersed in said etchant solution, means for periodically applying etching pulses to said electrode in alternating sequence to said checking current pulses, voltage sensing means connected across said diode, and means responsive to a voltage jump sensed by said sensing means, and operable to deenergize said electrode.

8. The apparatus of claim 7 in which the means for applying checking current and means for applying etching pulses both provide half-wave rectified pulses.

References Cited by the Examiner

UNITED STATES PATENTS

| | | | |
|---|---|---|---|
| 2,505,370 | 4/1950 | Sykes | 204—192 |
| 2,765,765 | 10/1956 | Bigler | 204—192 |
| 2,850,444 | 9/1958 | Armstrong et al. | 204—143 |
| 2,886,496 | 5/1959 | Eckfeldt | 204—195 |
| 2,940,024 | 6/1960 | Kurshan | 204—143 |
| 2,963,411 | 12/1960 | Scott | 204—143 |
| 2,975,342 | 3/1961 | Rediker | 204—143 |
| 2,979,444 | 4/1961 | Tiley | 204—143 |
| 3,023,153 | 2/1962 | Kurshan | 204—143 |
| 3,033,714 | 5/1962 | Ezaki et al. | 148—33 |
| 3,075,902 | 1/1963 | Bradley et al. | 204—143 |
| 3,081,418 | 3/1963 | Manintveld et al. | 156—17 |
| 3,110,849 | 12/1963 | Soltys | 156—17 X |
| 3,117,899 | 1/1964 | McLouski | 156—17 |

FOREIGN PATENTS

| | | |
|---|---|---|
| 761,795 | 11/1956 | Great Britain. |

JOHN H. MACK, *Primary Examiner.*

P. SULLIVAN, *Examiner.*

R. GOOCH, R. HARDER, R. MIHALEK, *Assistant Examiners.*